United States Patent
Chen et al.

(10) Patent No.: US 10,553,620 B2
(45) Date of Patent: Feb. 4, 2020

(54) DISPLAY PANEL

(71) Applicant: Innolux Corporation, Miao-Li County (TW)

(72) Inventors: Hung-Kun Chen, Miao-Li County (TW); Pei-Chieh Chen, Miao-Li County (TW); Hsia-Ching Chu, Miao-Li County (TW); Kuo-Chang Su, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/249,310

(22) Filed: Aug. 26, 2016

(65) Prior Publication Data
US 2017/0062489 A1    Mar. 2, 2017

(30) Foreign Application Priority Data
Aug. 28, 2015    (CN) ........................... 2015 1 0540381

(51) Int. Cl.
*H01L 27/12*    (2006.01)

(52) U.S. Cl.
CPC ........ *H01L 27/1248* (2013.01); *H01L 27/124* (2013.01)

(58) Field of Classification Search
CPC ................................ H01L 27/12; H01L 29/45
See application file for complete search history.

(56) References Cited

U.S. PATENT DOCUMENTS

| | | | |
|---|---|---|---|
| 2008/0251785 A1* | 10/2008 | Noh | H01L 27/12 257/40 |
| 2015/0116623 A1* | 4/2015 | Tomioka | G02F 1/136227 349/43 |
| 2015/0357354 A1* | 12/2015 | Hsu | H01L 29/7869 257/43 |

FOREIGN PATENT DOCUMENTS

TW    2014-30464 A    8/2014

OTHER PUBLICATIONS

Chinese Office Action dated Jan. 28, 2019.

* cited by examiner

*Primary Examiner* — Matthew C Landau
*Assistant Examiner* — Dmitriy Yemelyanov
(74) *Attorney, Agent, or Firm* — Rabin & Berdo, P.C.

(57) ABSTRACT

A display panel including a first substrate having a pixel region, a thin film transistor, an insulating layer, a pixel electrode, a second substrate, and a display medium is provided. The thin film transistor is located on the first substrate and in the pixel region. The insulating layer is located in the pixel region and covers the thin film transistor. The insulating layer has a contact hole having a first maximum distance extending along a first direction and a second maximum distance extending along a second direction. The first direction is different from the second direction. The second maximum distance is longer than the first maximum distance. The pixel electrode is electrically connected to the thin film transistor through the contact hole. The display medium is located between the first substrate and the second substrate.

20 Claims, 5 Drawing Sheets

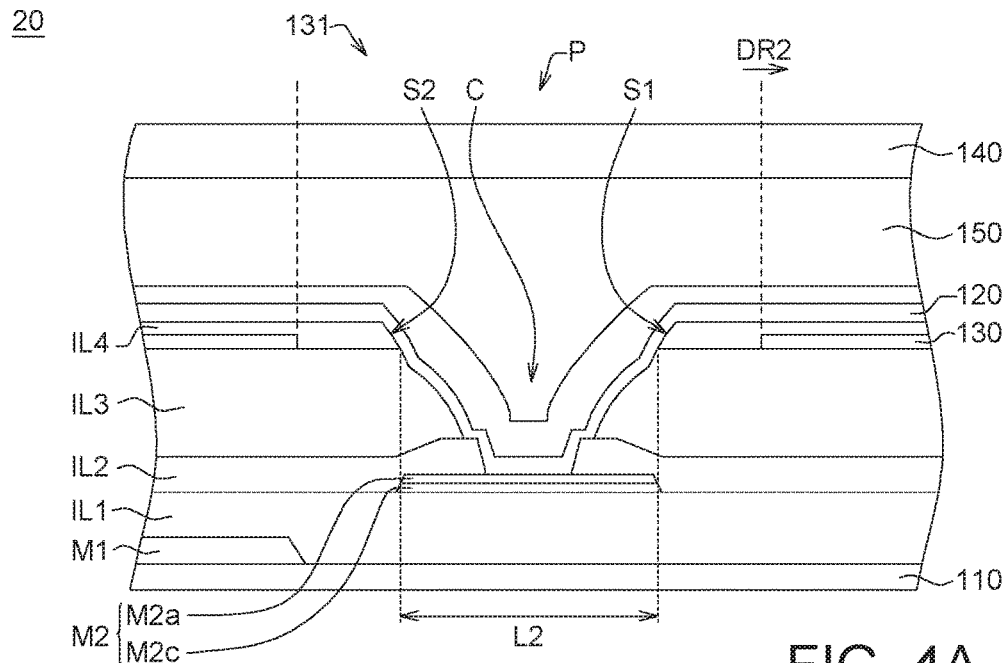
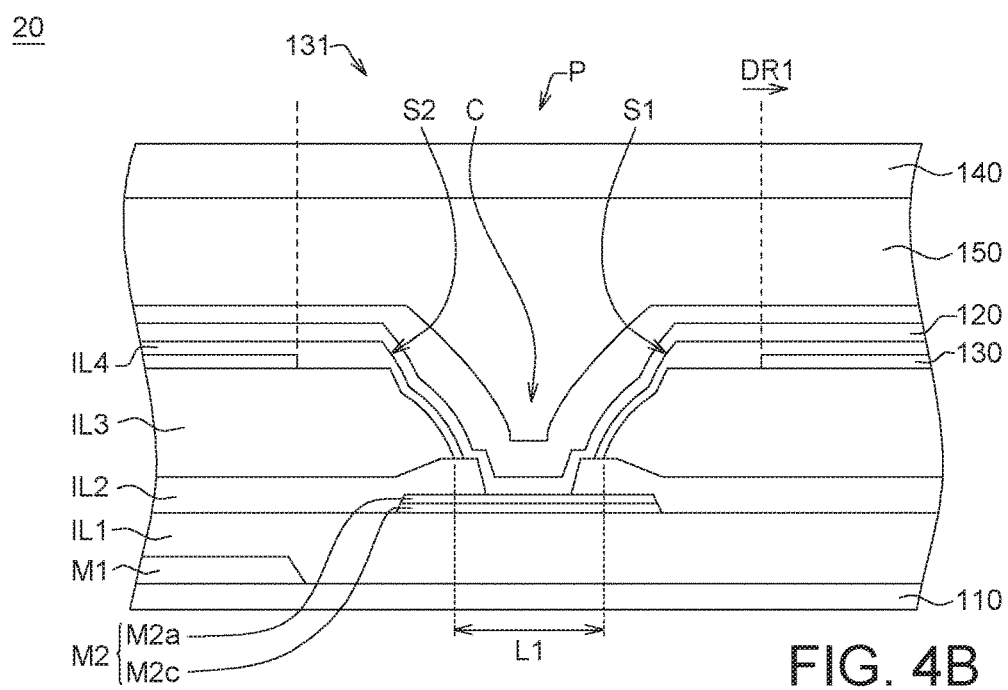

DISPLAY PANEL

This application claims the benefit of People's Republic of China application Serial No. 201510540381.7, filed Aug. 28, 2015, the subject matter of which is incorporated herein by reference.

BACKGROUND

Technical Field

The present disclosure relates in general to a display panel, and particularly to a display panel provided with manufacturing competitiveness.

Description of the Related Art

Liquid crystal displays and OLED displays have been widely used in various electronic products, such as mobile phones, notebooks and Tablet PCs. Moreover, as large-sized flat panel displays have been developed rapidly in the market, liquid crystal displays and OLED displays possessing the features of slimness, lightweight and compactness have gradually replaced the cathode ray tube (CRT) displays and become the mainstream product in the market.

However, along with the developments of manufacturing techniques of various displays, new issues easily arise influencing the display qualities. Therefore, how to provide a display with excellent display quality and manufacturing competitiveness has become a prominent task for the industries.

SUMMARY

The present disclosure relates to a display panel. In the display panel of the embodiments, the second maximum distance of the second patterned hole of the contact hole is longer than the first maximum distance of the first patterned hole of the contact hole, as such, even when shifts in manufacturing processes occur, the electrical connection area of the contact hole can be assured not to vary significantly.

According to an embodiment of the present disclosure, a display panel is provided. The display panel includes a first substrate, a thin film transistor, an insulating layer, a pixel electrode, a second substrate, and a display medium. The first substrate has a pixel region. The thin film transistor is located on the first substrate and in the pixel region. The insulating layer is located in the pixel region and covers the thin film transistor. The insulating layer has a contact hole. The contact hole has a first maximum distance extending along a first direction and a second maximum distance extending along a second direction, the first direction is different from the second direction, and the second maximum distance is longer than the first maximum distance. The pixel electrode is electrically connected to the thin film transistor via the contact hole. The display medium is located between the first substrate and the second substrate.

According to another embodiment of the present disclosure, a display panel is provided. The display panel includes a first substrate, a first metal layer, a first insulating layer, a second metal layer, a second insulating layer, a third insulating layer, a fourth insulating layer, a pixel electrode, a second substrate, and a display medium. The first substrate has a plurality of pixel regions. The first metal layer is disposed on the first substrate. The first insulating layer is disposed on the first metal layer. The second metal layer is disposed on the first insulating layer. The second insulating layer is disposed on the second metal layer. The third insulating layer is disposed on the second insulating layer. The fourth insulating layer is disposed on the third insulating layer. The pixel electrode is disposed on the fourth insulating layer. The first metal layer, the first insulating layer, the second metal layer, the second insulating layer, the third insulating layer, and the fourth insulating layer are located in at least one of the pixel regions. The display medium is located between the first substrate and the second substrate. The third insulating layer has a first patterned hole, and the first patterned hole has a first maximum distance extending along a first direction. The second insulating layer and the fourth insulating layer form a second patterned hole, the second patterned hole has a second maximum distance extending along a second direction, and the pixel electrode is electrically connected to the second metal layer via the first patterned hole and the second patterned hole. The second maximum distance of the second patterned hole is longer than the first maximum distance of the first patterned hole.

The above and other aspects of the disclosure will become better understood with regard to the following detailed description of the non-limiting embodiment(s). The following description is made with reference to the accompanying drawings.

BRIEF DESCRIPTION OF THE DRAWINGS

FIG. 4A shows a cross-sectional view along the section line A2-A2' in FIG. 3;

FIG. 4B shows a cross-sectional view along the section line B2-B2' in FIG. 3.

DETAILED DESCRIPTION

Figure 1:
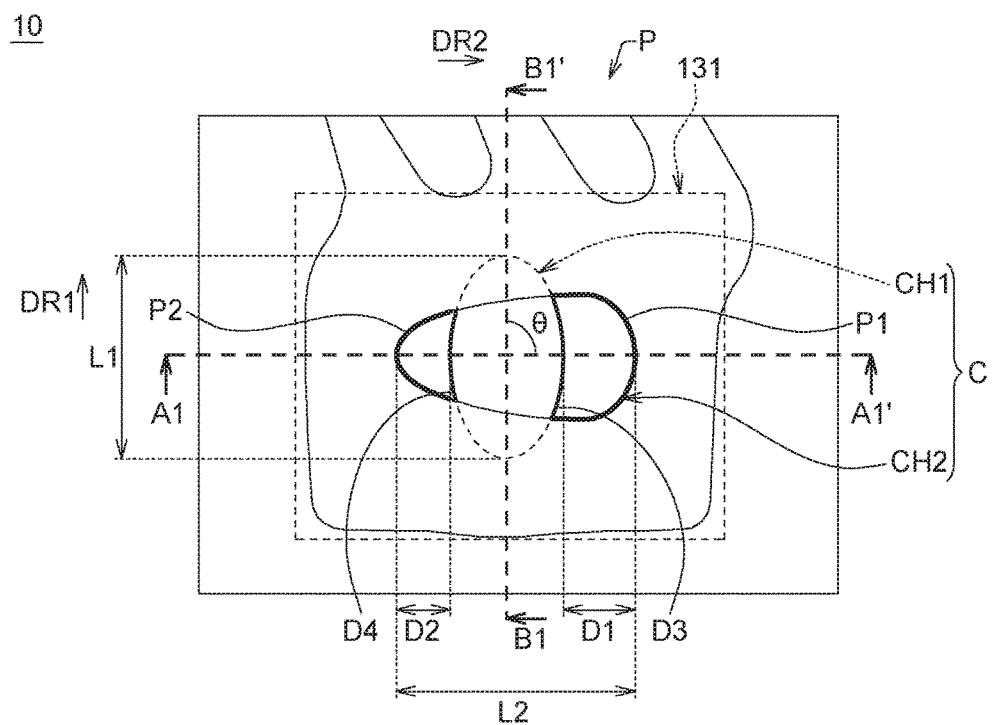
FIG. 1 shows a top view of a display panel according to an embodiment of the present disclosure.

In the embodiments of the present disclosure, a display device is provided. In the display panel of the embodiments, the second maximum distance of the second patterned hole of the contact hole is longer than the first maximum distance of the first patterned hole of the contact hole, as such, even when shifts in manufacturing processes occur, the electrical connection area of the contact hole can be assured not to vary significantly. A number of embodiments of the present disclosure are described below with accompanying drawings. The elements in the drawings sharing the same or similar labels are the same or similar elements. It should be noted that the accompanying drawings are simplified for more clearly elaborating the embodiments of the present disclosure, and detailed structures disclosed in the embodiments are for description not for limiting the scope of protection of the present disclosure. Also, anyone who is skilled in the technology field of the present disclosure can make necessary modifications or variations to these structures according to the needs in actual implementations.

Figure 2A:
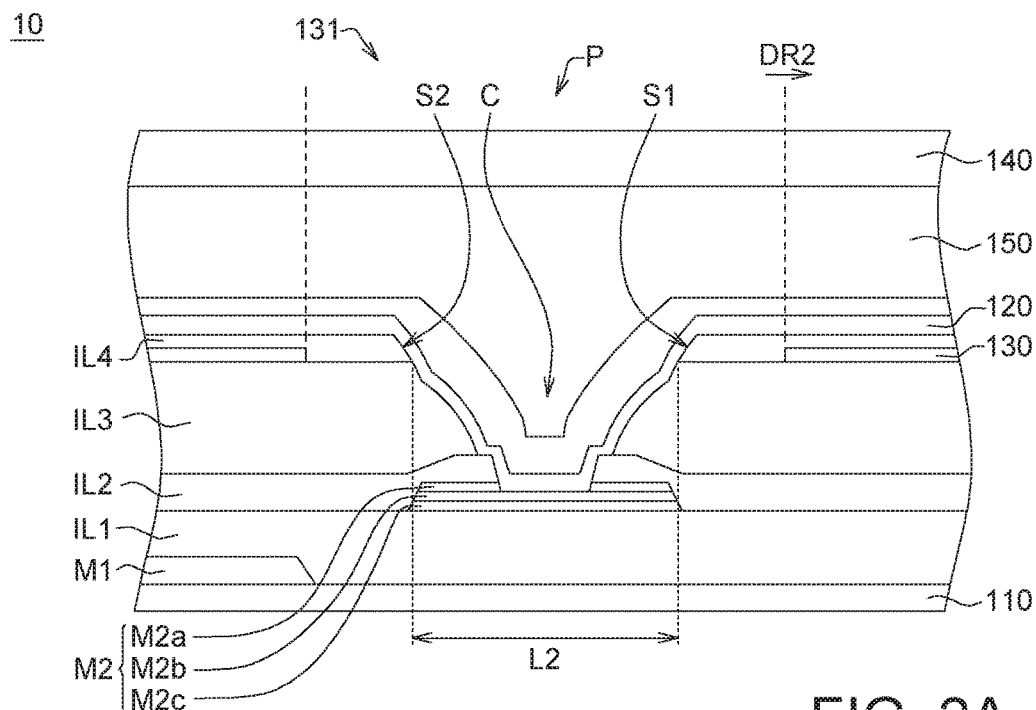
FIG. 2A shows a cross-sectional view along the section line A1-A1' in FIG. 1.
Figure 2B:
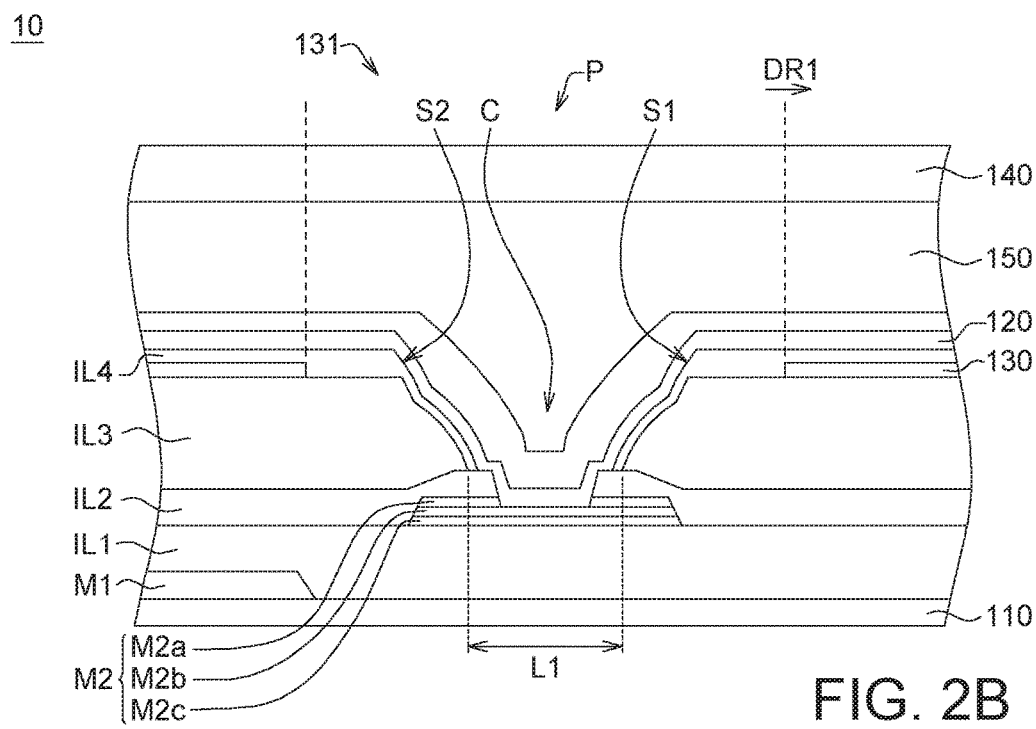
FIG. 2B shows a cross-sectional view along the section line B1-B1' in FIG. 1.

FIG. 1 shows a top view of a display panel according to an embodiment of the present disclosure, FIG. 2A shows a cross-sectional view along the section line A1-A1' in FIG. 1, and FIG. 2B shows a cross-sectional view along the section line B1-B1' in FIG. 1. As shown in FIGS. 1, 2A-2B, the display panel 10 includes a first substrate 110, a thin film transistor (not shown in the present drawing), an insulating layer IL, a pixel electrode 120, a second substrate 140, and a display medium 150. The first substrate 110 has at least a pixel region P. The thin film transistor is located on the first substrate 110 and in the pixel region P. The insulating layer IL is located in the pixel region P and covers the thin film transistor. The insulating layer IL has a contact hole C. The contact hole C has a first maximum distance L1 extending along a first direction DR1 and a second maximum distance L2 extending along a second direction DR2. An angle θ is formed between the first direction DR1 and the second direction DR2, and the second maximum distance L2 is longer than the first maximum distance L1. The pixel electrode 120 is electrically connected to the thin film transistor via the contact hole C. The display medium 150 is located between the first substrate 110 and the second substrate 140.

In some embodiments, the display panel 10 may be a liquid crystal panel, and the display medium 150 may be a liquid crystal layer. In some other embodiments, the display panel 10 may be an organic light-emitting-diode (OLED) display panel, and the display medium 150 may be a light emitting layer of an OLED.

It is to be noted that the term "maximum distance" used herein indicates the longest distance defined in the designated region. For example, the maximum distance of a rectangle region refers to the longest length of the rectangle region, and the maximum distance of an elliptical region refers to the long radius (major axis) of the elliptical region. In the embodiments of the present disclosure, the first maximum distance L1 is such as the longest distance from an edge extending to another edge of the contact hole C along the first direction DR1, the second maximum distance L2 is such as the longest distance from an edge extending to another edge of the contact hole C along the second direction DR2, and the first direction DR1 is different from the second direction DR2.

In some embodiments, as shown in FIGS. 2A-2B, the first substrate 110, the thin film transistor, and the insulating layer IL can for such as an array substrate. The first substrate 110 may have a plurality of pixel regions P. In at least one of the pixel regions P, the display panel 10 may include the first substrate 110, a first metal layer M1, a first insulating layer IL1, a second metal layer M2, a second insulating layer IL2, a third insulating layer IL3, a fourth insulating layer IL4, the pixel electrode 120, the second substrate 140, and the display medium 150. The first substrate has a plurality of pixel regions. The first metal layer M1 is disposed on the first substrate 110. The first insulating layer IL1 is disposed on the first metal layer M1. The second metal layer M2 is disposed on the first insulating layer IL1. The second insulating layer IL2 is disposed on the second metal layer M2. The third insulating layer IL3 is disposed on the second insulating layer IL2. The fourth insulating layer IL4 is disposed on the third insulating layer IL3. The pixel electrode 120 is disposed on the fourth insulating layer IL4. The first metal layer M1, the first insulating layer IL1, the second metal layer M2, the second insulating layer IL2, the third insulating layer IL3, and the fourth insulating layer IL4 are located in at least one of the pixel regions P.

In the embodiment, the first metal layer M1 is such as a scan line, and the second metal layer M2 is such as a data line connected to a drain.

In the embodiment, the third insulating layer IL3 is such as an organic insulating layer. In the embodiment, the second insulating layer IL2 and the fourth insulating layer IL4 are such as inorganic insulating layers, including, for example, silicon oxide or silicon nitride.

As shown in FIGS. 1, 2A-2B, the third insulating layer IL3 has a first patterned hole CH1, and the first patterned hole CH1 has a first maximum distance L1 extending along the first direction DR1. The second insulating layer IL2 and the fourth insulating layer IL4 form a second patterned hole CH2, and the second patterned hole CH2 has a second maximum distance L2 extending along the second direction DR2. The second maximum distance L2 of the second patterned hole CH2 is longer than the first maximum distance L1 of the first patterned hole CH1.

In the embodiment, the angle formed between the first metal layer (scan line) and the first direction DR1 is such as 0±10°, and the angle formed between the first metal layer (scan line) and the second direction DR2 is such as 0±10°. In the embodiment, the angle θ formed between the first direction DR1 and the second direction DR2 is such as 90±20°, and the angle θ is not 0° or 180°.

In the embodiment, the first patterned hole CH1 and the second patterned hole CH2 form the contact hole C. The pixel electrode 120 is electrically connected to the second metal layer M2 via the first patterned hole CH1 and the second patterned hole CH2. In other words, in the embodiment, the pixel electrode 120 is electrically connected to the thin film transistor via the contact hole C and the second metal layer M2.

As shown in FIG. 1, two ends of the second maximum distance L2 of the second patterned hole CH2 are respectively separated from the first patterned hole CH1 by a first minimum distance D1 and a second minimum distance D2, and the first minimum distance D1 is such as larger than the second minimum distance D2.

Referring to FIGS. 1 and 2A, a sidewall S1 of the second patterned hole CH2 has a first slope along the first minimum distance D1, another sidewall S2 of the second patterned hole CH2 has a second slope along the second minimum distance D2, and the first slope is such as smaller than the second slope.

In the embodiment, as shown in FIG. 1, along a top view direction of the first substrate 110, the second patterned hole CH2 has a first periphery segment P1 and a second periphery segment P2, and the first periphery segment P1 and the second periphery segment P2 respectively protrude outside two opposite sides of the first patterned hole CH1. The first peripheral segment P1 has a first perimeter, the second peripheral segment P2 has a second perimeter, and the first perimeter is such as larger than the second perimeter.

In the embodiment, as shown in FIG. 1, along a top view direction of the first substrate 110, the first patterned hole CH1 overlaps the second patterned hole CH2 by a first overlapping length D3 and a second overlapping length D4, and the first overlapping length D3 is such as longer than the second overlapping length D4.

In the embodiment, as shown in FIG. 2A, a sidewall S3 of the third insulating layer IL3 has a plurality of different slopes along the second direction DR2. In other words, the sidewall S3 of the first patterned hole CH1 has a plurality of different slopes along the second direction DR2.

In some embodiments, as shown in FIGS. 1, 2A-2B, the display panel 10 may further include a common electrode layer 130. The common electrode layer 130 is located in the insulating layer IL. The common electrode layer 130 has an opening 131, and the opening 131 surrounds the contact hole C.

In the embodiment, as shown in FIGS. 1, 2A-2B, the common electrode layer 130 is such as located between the third insulating layer IL3 and the fourth insulating layer IL4, and the opening 131 surrounds the first patterned hole CH1 and the second patterned hole CH2.

In the embodiment, as shown in FIGS. 1, 2A-2B, the thin film transistor may include a plurality of sub-metal layers disposed in a stack. The sub-metal layers may include an upper layer M2a, a middle layer M2b, and a lower layer M2c, and the pixel electrode 120 is electrically connected to a side of the upper layer M2a of the sub-metal layers via the contact hole C. In other words, in the present embodiment, the thin film transistor may include the second metal layer M2, and the second metal layer M2 may include the upper layer M2a, the middle layer M2b, and the lower layer M2c.

Specifically speaking, at least a partial region of the pixel electrode 120 is adjacent to and contacts a side of the upper layer M2a of the sub-metal layers, such that the pixel electrode 120 can be electrically connected to the side of the upper layer M2a of the sub-metal layers via the adjacent and contacting partial region. This adjacent and contacting partial region is represented as a continuous or non-continuous ring-shaped region. In other words, the pixel electrode 120 is electrically connected to the side of the upper layer M2a of the sub-metal layers via the continuous or non-continuous ring-shaped region.

In an embodiment, the pixel electrode 120 is electrically connected to a side of the upper layer M2a of the sub-metal layers via the second patterned hole CH2.

In the embodiment, the upper layer M2a/the middle layer M2b/the lower layer M2c of the sub-metal layers have a titanium (Ti)/aluminum (Al)/Ti structure or a molybdenum (Mo)/Al/Mo structure.

In the embodiment, the display panel 10 may further include a metal oxide layer (not shown in drawings) located between the pixel electrode 120 and the middle layer M2b of the sub-metal layers in the contact hole C.

Figure 3:
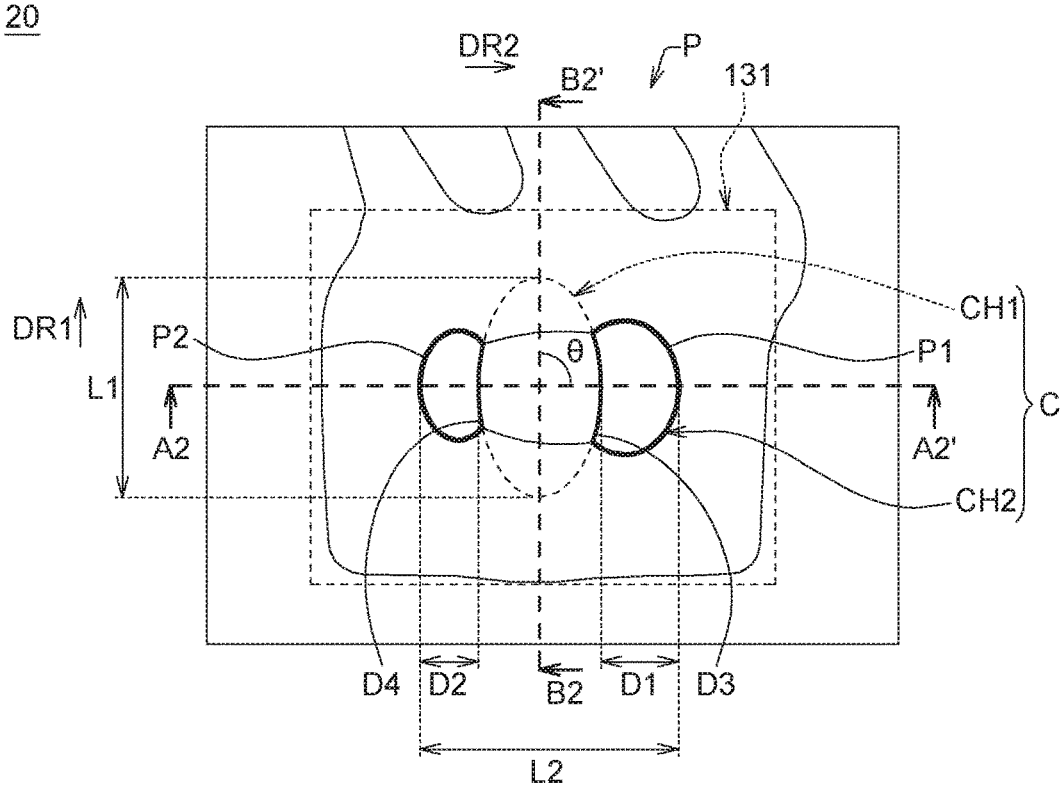
FIG. 3 shows a top view of a display panel according to another embodiment of the present disclosure.

FIG. 3 shows a top view of a display panel according to another embodiment of the present disclosure, FIG. 4A shows a cross-sectional view along the section line A2-A2' in FIG. 3, and FIG. 4B shows a cross-sectional view along the section line B2-B2' in FIG. 3. The elements in the present embodiment sharing the same or similar labels with those in the previous embodiments are the same or similar elements, and the description of which is omitted.

In the embodiment as shown in FIGS. 3, 4A-4B, the thin film transistor may include a plurality of sub-metal layers. The sub-metal layers are disposed in a stack, and the pixel electrode 120 is electrically connected to a surface of the second metal layer M2 via the second patterned hole CH2.

In an embodiment, as shown in FIGS. 3, 4A-4B, the sub-metal layers include an upper layer M2a and a lower layer M2c, and the pixel electrode 120 is electrically connected to a surface of the upper layer M2a of the sub-metal layers via the contact hole C. In other words, in the present embodiment, the thin film transistor may include the second metal layer M2, and the second metal layer M2 may include the upper layer M2a and the lower layer M2c.

Specifically speaking, at least a partial region of the pixel electrode 120 is adjacent to and contacts a surface of the upper layer M2a of the sub-metal layers, such that the pixel electrode 120 can be electrically connected to the surface of the upper layer M2a of the sub-metal layers via the adjacent and contacting partial region. This adjacent and contacting partial region is represented as a continuous full-plane region or a non-continuous partial-contacting region. In other words, the pixel electrode 120 is electrically connected to the surface of the upper layer M2a of the sub-metal layers via the continuous full-plane region or the non-continuous partial-contacting region.

In the embodiment, the upper layer M2a/the lower layer M2c may have such as a Ti/copper(Cu) structure.

In the present embodiment, as shown in FIG. 3, the first periphery segment P1 is protruded outside two ends of the first overlapping length D3, and the second periphery segment P2 is protruded outside two ends of the second overlapping length D4, such that the second patterned hole CH2 forms a dumb-bell shape. As such, the first periphery segment P1 and the first overlapping length D3 can form a region having relatively large area, and the second periphery segment P2 and the second overlapping length D4 can form a region having relatively large area. Compared to the situation where the second patterned hole CH2 does not have a dumb-bell shape, wherein the first periphery segment P1 and the second periphery segment P2 smoothly extend toward two opposite sides, such that both of the region formed from the first periphery segment P1 and the first overlapping length D3 and the region formed from the second periphery segment P2 and the second overlapping length D4 have relatively small areas. Consequently, according to the embodiments of the present disclosure, the fact that the first periphery segment P1 and the first overlapping length D3 can form a region having a relatively large area and that the second periphery segment P2 and the second overlapping length D4 can form a region having a relatively large area can lower the first slope of the sidewall S1 and the second slope of the sidewall S2 of the second patterned hole CH2, and such relatively large areas along with the lowered slopes can increase the covering area of the electrode layer, which may be the pixel electrode 120 and/or the common electrode layer 130, covered on the second patterned hole CH2, thereby reducing the occurrences of line-breaking or voids of the electrode layer(s) and hence enhancing the stability and performance of the display panel.

It is to be noted that the top view as shown in FIG. 3 may have a cross-sectional structure as shown in FIGS. 2A-2B, and likewise, the top view as shown in FIG. 1 may have a cross-sectional structure as shown in FIGS. 4A-4B as well.

Figure 5:
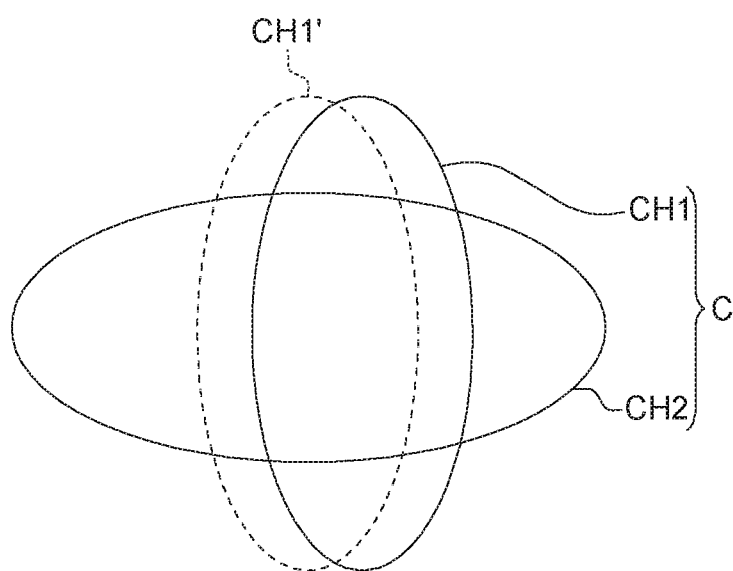
FIG. 5 shows a top view of a contact hole according to an embodiment of the present disclosure.

FIG. 5 shows a top view of a contact hole according to an embodiment of the present disclosure. As shown in FIG. 5, the contact hole C has the first patterned hole CH1 and the second patterned hole CH2, and the second maximum distance L2 of the second patterned hole CH2 is longer than the first maximum distance L1 of the first patterned hole CH1. As such, even when shifts in the manufacturing processes of the first patterned hole CH1 and the second patterned hole CH2 occur, the electrical connection area of the contact hole C can be assured not to vary significantly.

Specifically speaking, in the manufacturing process of the contact hole C, the third insulating layer IL3 is etched for forming the first patterned hole CH1, followed by etching the second insulating layer IL2 and the fourth insulating layer IL4 for forming the second patterned hole CH2. Therefore, as shown in FIG. 5, the first patterned hole CH1' is located in the center of the second patterned hole CH2, which represents the situation where shifts in the manufacturing process does not occur. While a shift occurs in the etching process of the second patterned hole CH2, an arrangement relationship is thus formed as represented by the first patterned hole CH1 and the second patterned hole CH2, where the first patterned hole CH1 is not located in the center of the second patterned hole CH2. According to the embodiments of the present disclosure, the second maximum distance L2 of the second patterned hole CH2 is longer than the first maximum distance L1 of the first patterned hole CH1, as such, even when shifts in manufacturing processes occur, the decrease of the electrical connection area can be reduced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display panel, comprising:
   a first substrate having a pixel region;
   an insulating layer located in the pixel region, wherein the insulating layer has a contact hole, the contact hole comprises a first patterned hole and a second patterned hole, the second patterned hole comprises a first periphery segment and a second periphery segment, and the first periphery segment and the second periphery segment respectively protrude outside two opposite sides of the first patterned hole; and
   a pixel electrode disposed on the insulating layer;
   wherein a distance axis of the second patterned hole defines a first maximum distance, the distance axis extends along a first direction and between a first end point located at one end of the second patterned hole in the first periphery segment and a second end point located at one end of the second patterned hole in the second periphery segment, and the first maximum distance is greater than a distance between any other two points along an outer edge of the contact hole;
   wherein a first point on the distance axis is located a predetermined distance from the first end point; and
   wherein a second point on the distance axis is located the predetermined distance from the second end point, and a width of the second patterned hole, in a second direction different from the first direction, crossing through the first point and the first periphery segment is different from a width of the second patterned hole, in the second direction, crossing through the second point and the second periphery segment.

2. The display panel according to claim 1, further comprising:
   a common electrode layer located in the insulating layer, wherein the common electrode layer has an opening, and the opening surrounds the contact hole.

3. The display panel according to claim 1, further comprising:
   a thin film transistor located on the first substrate and in the pixel region, wherein the thin film transistor comprises a plurality of sub-metal layers disposed in a stack, the sub-metal layers comprise an upper layer and a lower layer, and the pixel electrode is electrically connected to a surface of the upper layer of the sub-metal layers via the contact hole.

4. The display panel according to claim 3, wherein the upper layer and the lower layer of the sub-metal layers have a Ti/copper(Cu) structure.

5. The display panel according to claim 1, further comprising:
   a thin film transistor located on the first substrate and in the pixel region, wherein the thin film transistor comprises a plurality of sub-metal layers disposed in a stack, the sub-metal layers comprise an upper layer, a middle layer, and a lower layer, and the pixel electrode is electrically connected to a side of the upper layer of the sub-metal layers via the contact hole.

6. The display panel according to claim 5, wherein the upper layer, the middle layer, and the lower layer of the sub-metal layers have a titanium (Ti)/aluminum (Al)/Ti structure or a molybdenum(Mo)/Al/Mo structure.

7. The display panel according to claim 1, wherein an angle is formed between the first direction and the second direction, and the angle is 90±20°.

8. The display panel according to claim 1, wherein the first maximum distance is greater than a second maximum distance across the contact hole extending along the second direction.

9. A display panel, comprising:
   a first substrate having a pixel region;
   a first metal layer disposed on the first substrate;
   a first insulating layer disposed on the first metal layer;
   a second metal layer disposed on the first insulating layer;
   a second insulating layer disposed on the second metal layer;
   a third insulating layer disposed on the second insulating layer;
   a fourth insulating layer disposed on the third insulating layer;
   a pixel electrode disposed on the fourth insulating layer, wherein the first metal layer, the first insulating layer, the second metal layer, the second insulating layer, the third insulating layer, and the fourth insulating layer are disposed in the pixel region;
   a second substrate; and
   a display medium disposed between the first substrate and the second substrate;
   wherein the third insulating layer has a first patterned hole, and a first maximum distance across the first patterned hole extends along a first direction;
   wherein the second insulating layer and the fourth insulating layer form a second patterned hole, a second maximum distance across the second patterned hole extends along a second direction, and the pixel electrode is electrically connected to the second metal layer via the first patterned hole and the second patterned hole;
   wherein the second maximum distance is greater than the first maximum distance; and
   wherein the pixel electrode is in direct physical contact with a sidewall of the second insulating layer, a sidewall of the third insulating layer and a sidewall of the fourth insulating layer.

10. The display panel according to claim 9, wherein two ends of the second maximum distance of the second patterned hole are respectively separated from the first patterned hole by a first minimum distance and a second minimum distance, and the first minimum distance is larger than the second minimum distance.

11. The display panel according to claim 10, wherein a sidewall of the second patterned hole has a first slope along the first minimum distance, another sidewall of the second patterned hole has a second slope along the second minimum distance, and the first slope is smaller than the second slope.

12. The display panel according to claim 9, wherein along a top view direction of the first substrate, the second patterned hole has a first periphery segment and a second periphery segment respectively protruded outside two opposite sides of the first patterned hole, the first peripheral segment has a first perimeter, the second peripheral segment has a second perimeter, and the first perimeter is larger than the second perimeter.

13. The display panel according to claim 9, wherein along a top view direction of the first substrate, the first patterned hole overlaps the second patterned hole by a first overlapping length and a second overlapping length, and the first overlapping length is longer than the second overlapping length.

14. The display panel according to claim 9, wherein the sidewall of the third insulating layer has a plurality of different slopes along the second direction.

15. The display panel according to claim 9, further comprising:
 a common electrode layer located between the third insulating layer and the fourth insulating layer, wherein the common electrode layer has an opening, and the opening surrounds the first patterned hole and the second patterned hole.

16. The display panel according to claim 9, wherein the second metal layer comprises a plurality of sub-metal layers disposed in a stack, and the pixel electrode is electrically connected to a surface of the second metal layer via the second patterned hole.

17. The display panel according to claim 16, wherein the sub-metal layers comprise an upper layer and a lower layer, and the upper layer and the lower layer of the sub-metal layers have a Ti/copper(Cu) structure.

18. The display panel according to claim 9, wherein the second metal layer comprises a plurality of sub-metal layers disposed in a stack, the sub-metal layers comprise an upper layer, a middle layer, and a lower layer, and the pixel electrode is electrically connected to a side of the upper layer of the sub-metal layers via the second patterned hole.

19. The display panel according to claim 18, wherein the upper layer, the middle layer, and the lower layer of the sub-metal layers have a titanium (Ti)/aluminum (Al)/Ti structure or a molybdenum(Mo)/Al/Mo structure.

20. The display panel according to claim 9, wherein the first metal layer is a scan line, and the second metal layer is a data line.

* * * * *